United States Patent
Wang et al.

(10) Patent No.: US 10,248,272 B2
(45) Date of Patent: Apr. 2, 2019

(54) TOUCH SUBSTRATE AND TOUCH SCREEN

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Qingpu Wang, Beijing (CN); Ming Hu, Beijing (CN); Tsung Chieh Kuo, Beijing (CN); Lei Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 50 days.

(21) Appl. No.: 15/679,235

(22) PCT Filed: Feb. 23, 2017

(86) PCT No.: PCT/CN2017/074596
§ 371 (c)(1),
(2) Date: Aug. 17, 2017

(87) PCT Pub. No.: WO2017/219693
PCT Pub. Date: Dec. 28, 2017

(65) Prior Publication Data
US 2018/0173337 A1    Jun. 21, 2018

(30) Foreign Application Priority Data
Jun. 23, 2016    (CN) .......................... 2016 1 0463820

(51) Int. Cl.
*H05K 1/02*    (2006.01)
*G06F 3/044*    (2006.01)

(52) U.S. Cl.
CPC .......... *G06F 3/044* (2013.01); *H05K 1/0259* (2013.01); *H05K 1/0274* (2013.01);
(Continued)

(58) Field of Classification Search
CPC .......... G06F 2203/04111; G06F 3/044; H05K 2201/09272; H05K 1/0259; H05K 1/02
See application file for complete search history.

(56) References Cited

U.S. PATENT DOCUMENTS

2013/0341651 A1*  12/2013  Kim .................... H01L 31/0232
                                                              257/84
2014/0055380 A1*  2/2014   Han ....................... G06F 3/041
                                                              345/173
(Continued)

FOREIGN PATENT DOCUMENTS

CN    104267855 A    1/2015
CN    106201135 A    12/2016

OTHER PUBLICATIONS

Search Report for International Patent Application No. PCT/CN/2017/074596 dated May 27, 2017.

*Primary Examiner* — Ricardo Osorio
(74) *Attorney, Agent, or Firm* — Calfee, Halter & Griswold LLP

(57) ABSTRACT

The present disclosure provides a touch substrate and a touch screen, which belongs to the field of touch technology. The touch substrate includes a touch region and a black matrix pattern surrounding the touch region, the touch substrate including a plurality of touch electrode patterns, wherein the touch electrode pattern includes a first portion overlapped on the black matrix pattern, and wherein in the first portion, if an included angle formed by a first edge and an extending line of a second edge is less than 120°, the first edge and the second edge are formed to be connected with at least one third edge, such that included angles between (Continued)

two edges adjacent to each other among the first edge, the second edge and the third edge are greater than 120°.

20 Claims, 5 Drawing Sheets

(52) U.S. Cl.
CPC ........... *G06F 2203/04103* (2013.01); *G06F 2203/04111* (2013.01); *H05K 2201/09272* (2013.01); *H05K 2201/10128* (2013.01); *H05K 2201/10151* (2013.01)

(56) References Cited

U.S. PATENT DOCUMENTS

| | | | |
|---|---|---|---|
| 2014/0060901 A1* | 3/2014 | Kim | H05K 1/0296 |
| | | | 174/257 |
| 2014/0125885 A1* | 5/2014 | Noh | G06F 1/1692 |
| | | | 349/12 |
| 2016/0202802 A1* | 7/2016 | Ono | G06F 3/044 |
| | | | 345/174 |
| 2017/0329186 A1* | 11/2017 | Tsai | G02F 1/133345 |

* cited by examiner

TOUCH SUBSTRATE AND TOUCH SCREEN

CROSS REFERENCE

The present application is based upon International Application No. PCT/CN2017/074596, filed on Feb. 23, 2017, which is based upon and claims priority to Chinese Patent Application No. 201610463820.3, filed on Jun. 23, 2016, and the entire contents thereof are incorporated herein by reference.

TECHNICAL FIELD

The present disclosure relates to the field of touch technology, and more particularly, to a touch substrate and a touch screen.

BACKGROUND

In recent years, with improvement of controllability of a mobile electronic apparatus and development of the electronic technology, the touch screen technology has been widely applied in mobile phones, tablets, notebook computers and other electronic apparatuses. The touch technology has been developed in resistance, capacitance, electromagnetic and other different technical directions. The capacitive touch screen has become a mainstream product with its low cost and excellent user experience.

With rapid growth of the capacitive touch screen, people's demand for the ESD (Electro-Static Discharge) performance of the touch product becomes higher and higher. The ESD may cause performance deterioration of the internal device of the touch screen or cause electric breakthrough to lead to permanent failure, such as an open circuit or a short circuit inside the touch screen.

An existing touch substrate includes a touch region for touch detection and a black matrix pattern surrounding the touch region. The black matrix pattern is generally made of a carbon ball, and the black matrix pattern usually has excellent insulation performance. However, after being subject to a plurality of high temperature processes, the resistivity of the black matrix pattern is reduced and the insulation performance is lowered. In this way, when the electrostatic charge from the apparatus or the human body contacts the touch electrode overlapped on the black matrix pattern, an extremely large discharge current is instantaneously generated between different touch electrodes, resulting in breakthrough of the black matrix pattern, resulting in an open circuit or a short circuit between the touch electrodes, and resulting in touch performance deterioration or permanent failure of the corresponding region.

It should be noted that, information disclosed in the above background portion is provided only for better understanding of the background of the present disclosure, and thus it may contain information that does not form the prior art known by those ordinary skilled in the art.

SUMMARY

Embodiments of the present disclosure provide a technical solution as follows.

In one aspect, there is provided a touch substrate, including a touch region and a black matrix pattern surrounding the touch region, the touch substrate comprising a plurality of touch electrode patterns, wherein the touch electrode pattern includes a first portion overlapped on the black matrix pattern, and wherein in the first portion, if an included angle formed by a first edge and an extending line of a second edge is less than 120°, the first edge and the second edge are formed to be connected with at least one third edge, such that included angles between two edges adjacent to each other among the first edge, the second edge and the third edge are greater than 120°.

A touch screen is also provided by embodiments of the present disclosure, including: a display panel; and the touch substrate described above.

A touch substrate is also provided by embodiments of the present disclosure, including: a touch region and a black matrix pattern surrounding the touch region, the touch substrate comprising a plurality of touch electrode patterns, wherein the touch electrode pattern includes a first portion overlapped on the black matrix pattern, and wherein in the first portion, if an included angle formed by a first edge and an extending line of a second edge is less than 120°, the first edge and the second edge are formed to be connected with at least one third edge, and the third edge at least partially has a smooth shape.

A touch screen is also provided by embodiments of the present disclosure, including: a display panel; and the touch substrate according to the present disclosure.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

The accompanying drawings provides a further understanding of the present disclosure and constitute a part of the specification, together with the following detailed description, to serve for explanation of the present disclosure, but not to be construed as limiting the present disclosure. In the drawings.

REFERENCE NUMERALS

1 Touch electrode pattern
2 First Portion
3 Black matrix pattern
5 Smooth shape

DETAILED DESCRIPTION

In order to make the technical problems to be solved by the embodiments of the present disclosure, technical solutions and advantages more clearly, detailed description will be made below in combination with the accompanying drawings and specific embodiments.

Figure 1:
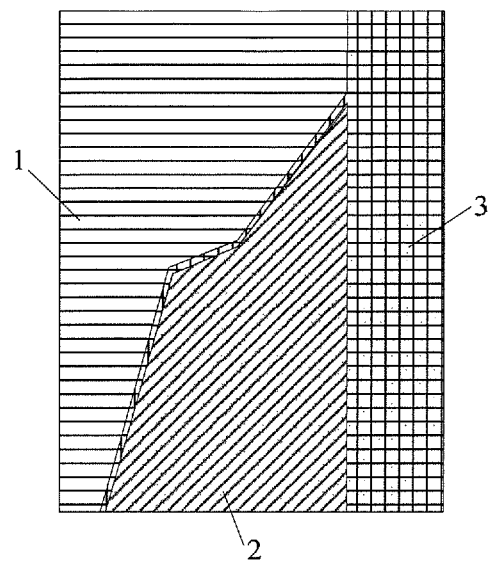
FIG. 1 is a schematic diagram of a touch electrode pattern in an existing touch substrate.

FIG. 1 is a schematic diagram of a touch electrode pattern in an existing touch substrate. The existing touch substrate includes a touch region for touch detection and a black matrix pattern 3 surrounding the touch region. The touch region is provided with a touch electrode pattern 1. The touch electrode pattern 1 includes a first portion 2 which is overlapped on the black matrix pattern 3. It can be seen that an included angle between any adjacent two edges of the first portion 2 is small, a tip position of the touch electrode pattern has large surface charge density and high electric field intensity, so that ESD is liable to be generated between the adjacent touch electrode patterns, causing breakthrough of the surrounding black matrix pattern, resulting in an open circuit or a short circuit between the touch electrodes, and resulting in touch performance deterioration or permanent failure of the corresponding region.

In order to solve the above-mentioned problems, the present disclosure provides a touch substrate and a method of manufacturing the same, which may improve the ESD resistance of the touch screen.

Embodiment 1

The present embodiment provides a touch substrate, including a touch region and a black matrix pattern surrounding the touch region, the touch substrate being provided with a plurality of touch electrode patterns, wherein the touch electrode pattern includes a first portion overlapped on the black matrix pattern. The included angle between any adjacent two edges of the first portion is greater than a preset threshold value.

According to the present embodiment, for example, in the first portion, if an included angle formed by a first edge and an extending line of a second edge is less than the preset threshold value, the first edge and the second edge are formed to be connected with at least one third edge, such that included angles between two edges adjacent to each other among the first edge, the second edge and the third edge are greater than preset threshold value. With the above structure, the included angle between any adjacent two edges of the first portion may be greater than the preset threshold value.

When an included angle between adjacent two edges of the touch electrode pattern overlapped on the black matrix pattern is small, a tip position of the touch electrode pattern has large surface charge density and high electric field intensity, so that ESD is liable to be generated between the adjacent touch electrode patterns, causing breakthrough of the surrounding black matrix pattern. A large number of experiments have verified that, the electric field intensity at the tip of the touch electrode pattern will be weakened as the included angle between adjacent two edges of the touch electrode pattern increases. Therefore, in the present embodiment, an included angle between any adjacent two edges of the portion of the touch electrode pattern overlapped on the black matrix is greater than a preset threshold value. In this way, the electric field intensity at the tip position of the touch electrode pattern which is overlapped on the black matrix pattern may be reduced, thereby reducing the risk of electric breakthrough of the black matrix pattern, which improves the ESD resistance of the edge region of the touch substrate, enhances the ESD resistance of the overall product, and improves the production yield of the touch substrate.

The touch substrate of the present embodiment may be a mutual-capacitance type touch substrate or a self-capacitance type touch substrate. When the touch substrate is a mutual-capacitance type touch substrate, the touch electrode includes a touch sensing electrode and a touch driving electrode. The included angle between any adjacent two edges of the first portion of the a touch sensing electrode or the touch driving electrode which is overlapped on the black matrix pattern is greater than a preset threshold value. When the touch substrate is a self-capacitance type touch substrate, the touch electrode is a self-capacitance type touch electrode. The included angle between any adjacent two edges of the first portion of the self-capacitance type touch electrode which is overlapped on the black matrix pattern is greater than a preset threshold value.

When the touch substrate is a mutual-capacitance type touch substrate, since the breakthrough of the black matrix pattern affects a touch sensing signal greatly, the included angle between any adjacent two edges of the first portion of the touch sensing electrode which is overlapped on the black matrix pattern may be set to be greater than the preset threshold value.

In addition, in the present embodiment, it is possible to change only the touch electrode pattern overlapped on the black matrix pattern, and the touch electrode pattern located in a touch region at the center of the touch substrate may have the same shape as the prior art. Since no black matrix pattern exists in the touch region at the center of the touch substrate, and the ESD is less prone to occur. Therefore, it is possible to maintain the touch electrode pattern of the touch region unchanged, to avoid affecting the performance of the touch substrate.

In a specific embodiment, the first portion includes a first line segment, a second line segment, a third line segment, . . . , and an $n^{th}$ line segment which are sequentially connected end to end, wherein an included angle between a $k^{th}$ line segment and a $(k+1)^{th}$ line segment is greater than a preset threshold value, k is an integer not less than 1 and not greater than n−1, and n is a positive integer greater than 2.

In one embodiment, optionally, n is a positive integer less than 10.

In particular, each of lengths of the second line segment, the third line segment, . . . , and the $(n-1)^{th}$ line segment may be equal to each other.

Figure 6:
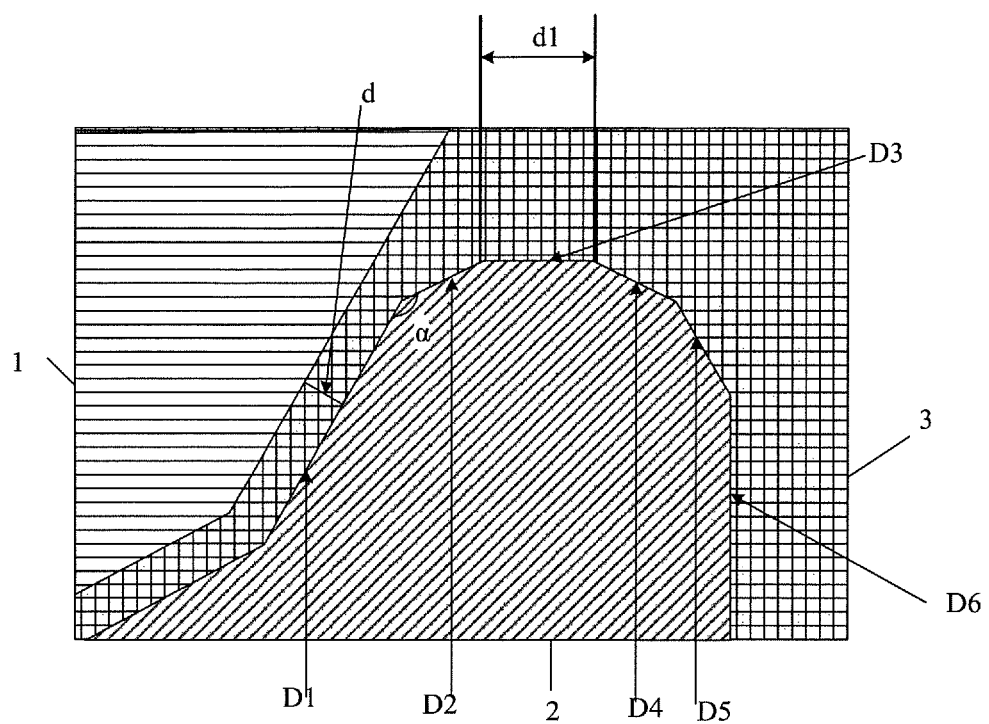
FIG. 6 is an enlarged schematic view of part A of FIG. 5.

A large number of experiments have verified that, the electric field concentration range at the tip is less than d at the above included angles. Each of lengths of the second line segment, the third line segment, . . . , and the $(n-1)^{th}$ line segment may be set to be greater than 1.5 d, such that the electric field intensity at the tip of the touch electrode pattern will be significantly reduced, wherein d is an interval between adjacent touch electrode patterns (as shown in FIG. 6).

Preferably, each of lengths of the second line segment, the third line segment, . . . , and the $(n-1)^{th}$ line segment is equal to 2 d. In this way, the electric field intensity at the tip of the touch electrode pattern may be significantly reduced, without changing the touch electrode pattern too much.

Figure 2:
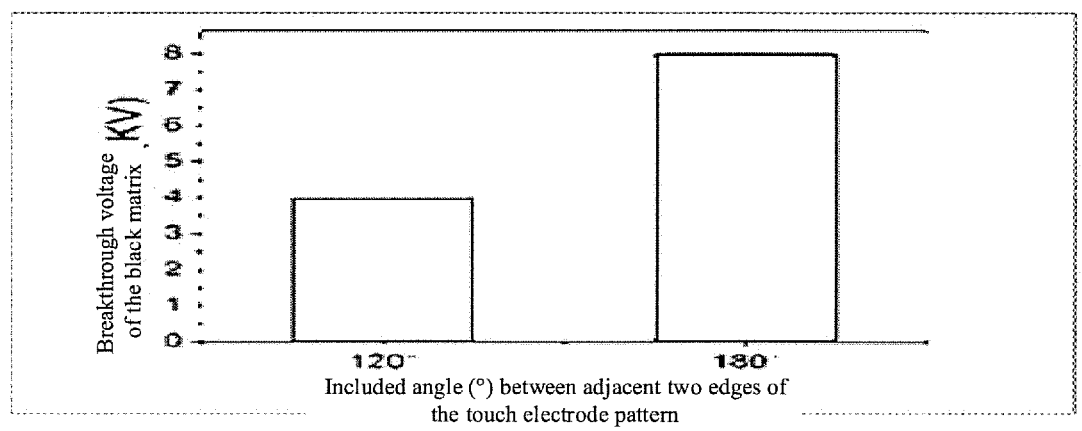
FIG. 2 is a schematic diagram showing the relationship between an included angle between adjacent two edges of the touch electrode pattern and the breakthrough voltage of the black matrix.
Figure 3A:
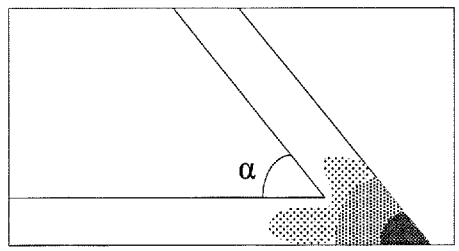
FIGS. 3a-3d are schematic diagrams showing the relationship between an included angle between adjacent two edges of the touch electrode pattern and the electric field intensity.
Figure 3B:
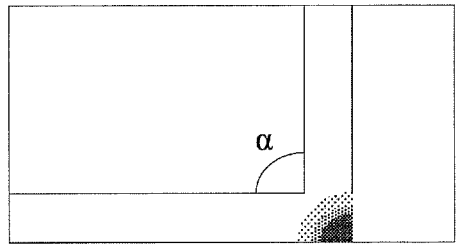
Figure 3C:
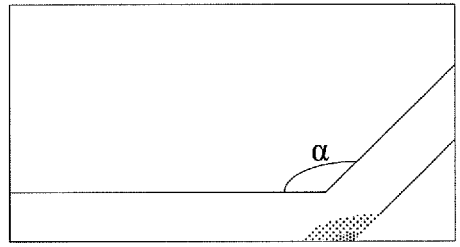
Figure 3D:
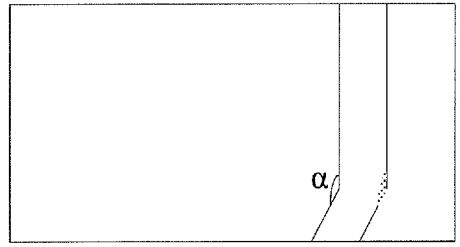

FIG. 2 is a schematic diagram showing the relationship between an included angle between adjacent two edges of the touch electrode pattern and the breakthrough voltage of the black matrix. As can be seen from FIG. 2, when the included angle between adjacent two edges of the touch electrode pattern increases, the breakthrough voltage of the black matrix pattern significantly increases.

Figure 4:
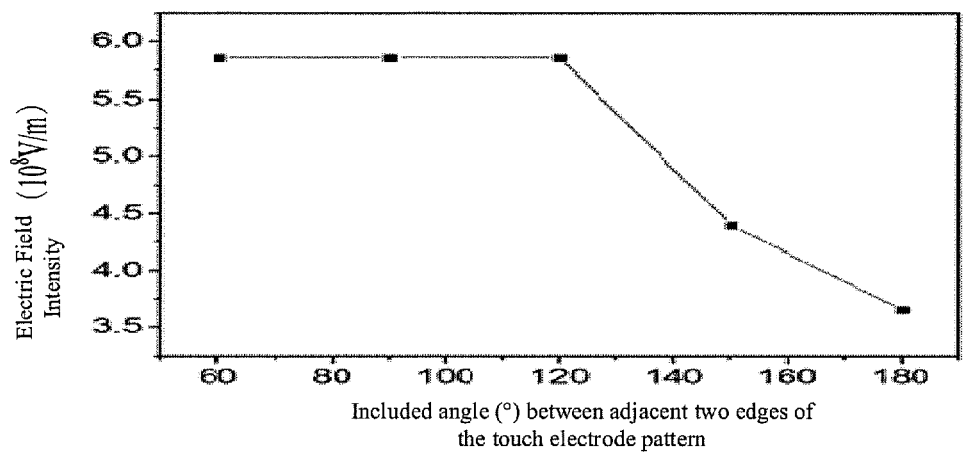
FIG. 4 is a schematic diagram showing the relationship between an included angle between adjacent two edges of the touch electrode pattern and the electric field intensity.

FIGS. 3a-3d are schematic diagrams showing the relationship between an included angle α between adjacent two edges of the touch electrode pattern and the electric field intensity. The denser the points are, the greater the electric field intensity is. FIG. 4 is a schematic diagram showing the relationship between an included angle between adjacent two edges of the touch electrode pattern and the electric field intensity. It can be seen from the FIG. 4, when the included angle between adjacent two edges of the touch electrode pattern is 60-120°, the electric field at the tip of the touch electrode pattern is strong; and when the included angle between adjacent two edges of the touch electrode pattern is 150-180°, the electric field at the tip of the touch electrode pattern is significantly reduced. As the included angle between adjacent two edges of the touch electrode pattern increases, the highest electric field intensity at the tip of the touch electrode pattern is reduced, thereby increasing the breakthrough voltage of the black matrix pattern and reducing the risk of electric breakthrough of the black matrix pattern.

Since the electric field intensity at the tip of the touch electrode pattern will be significantly reduced when the included angle between any adjacent two edges of the touch electrode pattern is greater than 120°, the included angle between any adjacent two edges of the first portion is greater than 120° in the present embodiment.

Thus, according to the present embodiment, in the first portion, if an included angle formed by a first edge and an extending line of a second edge is less than 120°, the first edge and the second edge are formed to be connected with at least one third edge, such that included angles between two edges adjacent to each other among the first edge, the second edge and the third edge are greater than 120°.

Preferably, when the included angle between any adjacent two edges of the touch electrode pattern is greater than 120° and less than 170°, the electric field intensity at the tip of the touch electrode pattern will be rapidly decreased.

Further, the included angle between any adjacent two edges of the first portion is 150°, so that the electric field intensity at the tip of the touch electrode pattern may be significantly reduced, without changing the touch electrode pattern too much.

In the present disclosure, the included angle between any adjacent two edges represents the smaller one formed by the two edges. However, the present disclosure is not limited thereto, and it is also possible to use the greater one of the two included angles to represent the angle of adjacent two edges. In this case, the angle range is the range of difference between the angle in the above embodiment and the angle of circumference (360°). For example, in an embodiment that the included angle between any adjacent two edges of the first portion is 150°, it may be expressed as 360°-150°=210°.

Embodiment 2

The present embodiment also provides a touch screen including a display panel and a touch substrate described above. The touch screen may be applied in a human-computer interaction apparatus.

Embodiment 3

The present embodiment provides a method of manufacturing a touch substrate. The touch substrate includes a touch region and a black matrix pattern surrounding the touch region. The manufacturing method includes:

forming a plurality of touch electrode patterns including a first portion overlapped on the black matrix pattern, the included angle between any adjacent two edges of the first portion being greater than a preset threshold value.

When an included angle between adjacent two edges of the touch electrode pattern overlapped on the black matrix pattern is small, a tip position of the touch electrode pattern has large surface charge density and high electric field intensity, so that ESD is liable to be generated between the adjacent touch electrode patterns, causing breakthrough of the surrounding black matrix pattern. A large number of experiments have verified that, the electric field intensity at the tip of the touch electrode pattern will be weakened as the included angle between adjacent two edges of the touch electrode pattern increases. Therefore, in the present embodiment, an included angle between any adjacent two edges of the portion of the touch electrode pattern overlapped on the black matrix is greater than a preset threshold value. In this way, the electric field intensity at the tip position of the touch electrode pattern which is overlapped on the black matrix pattern may be reduced, thereby reducing the risk of electric breakthrough of the black matrix pattern, which improves the ESD resistance of the edge region of the touch substrate, enhances the ESD resistance of the overall product, and improves the production yield of the touch substrate.

In a specific embodiment, the forming a plurality of touch electrode patterns includes:

forming the first portion including a first line segment, a second line segment, a third line segment, . . . , and an $n^{th}$ line segment which are sequentially connected end to end, wherein an included angle between a $k^{th}$ line segment and a $(k+1)^{th}$ line segment is greater than a preset threshold value, k is an integer not less than 1 and not greater than n−1, and n is a positive integer greater than 2.

In one embodiment, optionally, n is a positive integer less than 10.

Since the electric field intensity at the tip of the touch electrode pattern will be rapidly decreased when the included angle between any adjacent two edges of the touch electrode pattern is greater than 120° and less than 170°, the manufacturing method specifically includes:

forming the first portion in which an included angle between any adjacent two edges is greater than 120° and less than 170°.

Further, forming the first portion in which an included angle between any adjacent two edges is greater than 120° and less than 170° specifically includes:

forming the first portion in which an included angle between any adjacent two edges is 150°, so that the electric field intensity at the tip of the touch electrode pattern may be significantly reduced, without changing the touch electrode pattern too much.

The method of manufacturing the touch substrate generally includes following process.

The first photolithography process: a black matrix pattern is formed on the substrate base and the black matrix pattern covers an edge region of the touch substrate.

The second photolithography process: a bridge for connecting the touch electrodes is formed on the substrate base.

The third photolithography process: a resin insulating layer covering the bridge is formed on the substrate base.

The fourth photolithography process: a pattern of the touch electrode is formed on the substrate base, and the touch electrode is overlapped on the black matrix pattern in the edge region of the touch substrate.

The fifth photolithography process: external metal wiring is formed on the black matrix pattern on the substrate base.

The sixth photolithography process: a resin protective layer at least covering the external metal wiring is formed on the substrate base.

In the present embodiment, when the touch electrode pattern is formed in the fourth photolithography process, the first portion of the touch electrode pattern overlapped on the black matrix pattern is improved, such that the included angle between any adjacent two edges of the first portion is greater than the preset threshold value. In this way, the technical solution of the present embodiment may be realized without increasing the patterning process, which does not increase the difficulty of the manufacturing process of the touch substrate.

Embodiment 4

Figure 5:
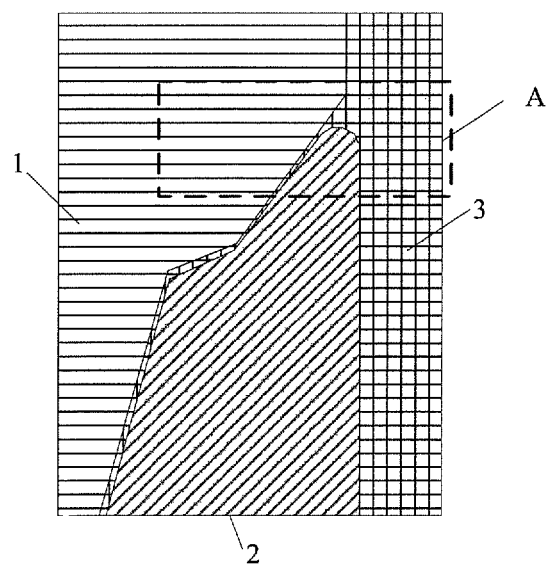
FIG. 5 is a structural schematic diagram of a touch electrode pattern of a touch substrate according to an embodiment of the present disclosure.

As shown in FIGS. 5 and 6, the touch substrate of the present embodiment includes a touch region and a black matrix pattern 3 surrounding the touch region. The touch substrate is provided with a plurality of touch electrode patterns 1. The touch electrode pattern 1 includes a first portion 2 overlapped on the black matrix pattern 3. It can be seen from FIG. 6, in the first portion 2 includes a first line segment D1, a second line segment D2, a third line segment D3, a fourth line segment D4, a fifth line segment D5 and a sixth line segment D6 which are sequentially connected end to end. An included angle α is formed between adjacent two line segments. Of course, the number of line segments included in the first portion is not limited to 6, but it may also be other natural numbers greater than 2. Optionally, in order to facilitate the process, the number of line segments included in the first portion may be less than 10.

As shown in FIGS. 3a to 3d and FIG. 4, the electric field intensity at the tip of the touch electrode pattern will be rapidly decreased when the included angle α between adjacent two line segments is in the range of 150° to 180°. Therefore, the included angle α between adjacent two line segments is set to be 150° in the present embodiment.

Specifically, each of lengths of the second line segment D2, the third line segment D3, the fourth line segment D4 and the fifth line segment D5 may be equal to each other.

Since the electric field concentration range at the tip of the touch electrode pattern is within 30 μm when the included angle α between adjacent two line segments is 60° to 150°, lengths dl of the second line segment D2, the third line segment D3, the fourth line segment D4 and the fifth line segment D5 may be set to be 60 μm. In this way, the electric field intensity at the tip of the first portion will be significantly reduced, thereby reducing the risk of electric breakthrough of the black matrix pattern, which improves the ESD resistance of the edge region of the touch substrate, enhances the ESD resistance of the overall product, and improves the production yield of the touch substrate.

In the foregoing embodiments, the first portion 2 of the touch electrode pattern 1 is formed by a plurality of straight line segments, but the present disclosure is not limited thereto. In other embodiments of the present disclosure, the first portion 2 of the touch electrode pattern 1 may also be formed by a curved line segment.

Figure 7:
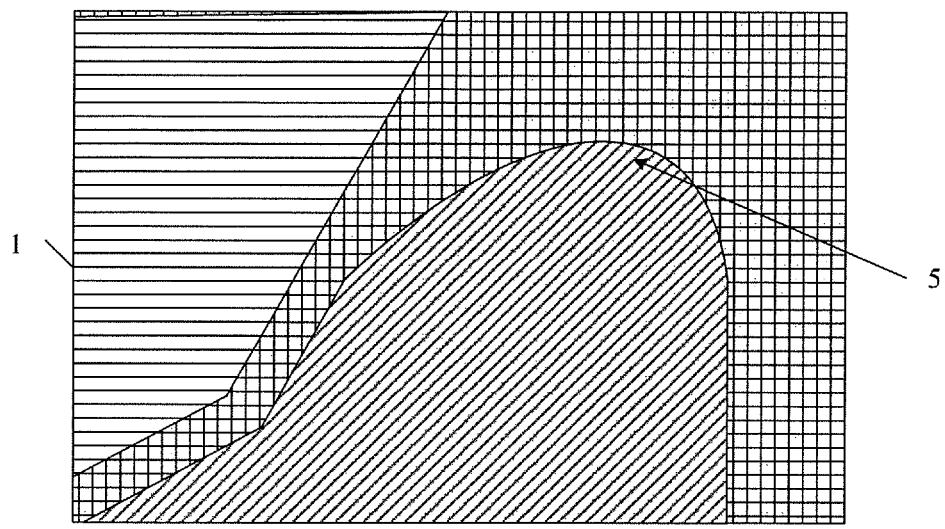
FIG. 7 is an enlarged view showing a partial structure of a touch electrode pattern of a touch substrate according to another embodiment of the present disclosure.

FIG. 7 is an enlarged view showing a partial structure of a touch electrode pattern of a touch substrate according to another embodiment of the present disclosure. Referring to FIG. 7, the touch substrate according to the present embodiment includes a touch region and a black matrix pattern surrounding the touch region, the touch substrate is provided with a plurality of touch electrode patterns, wherein the touch electrode pattern includes a first portion overlapped on the black matrix pattern. The first portion is formed to have a smooth shape 5. With this smooth shape 5, portions (e.g., as shown in FIG. 1) which are likely to form sharp angles therebetween are connected to each other by edges having smooth shapes, thereby avoiding the sharp angles.

Thus, according to the present embodiment, in the first portion, if an included angle formed by a first edge and an extending line of a second edge is less than the preset threshold value (for example, 120°), the first edge and the second edge are formed to be connected with at least one third edge, and the third edge at least partially has a smooth shape.

In the present embodiment, with the smooth shape, the edge of the first portion does not have a sharp angle, but rather the first portion is formed by circular-arc transition. For example, the smooth shape may consist of one or more circular-arc curves.

For example, the smooth shape may be a shape that is gently and gradually transitioned from a direction of one edge to a direction of the other edge. For example, the smooth shape may a substantially circular shape (e.g., a semicircular shape, a quarter circular shape, etc.), a substantially arc shape, a substantially parabolic shape or the like, and any combination thereof, as long as it may avoid the sharp included angles being generated between two edges.

According to some embodiments of the present disclosure, a radius of curvature of the arc-shaped curve constituting the first portion having a smooth shape is greater than a predetermined threshold value, such that the smooth shape has a relatively gentle curved shape. For example, the radius of curvature may be greater than 30 μm, but the present disclosure is not limited thereto. The arc-shaped curve constituting the first portion having a smooth shape may have a radius of curvature in other ranges or may be composed of multiple segments of arc-shaped curves having different radiuses of curvature.

Other embodiments of the present disclosure also provide a touch screen including: a display panel; and the touch substrate according to the above embodiments.

According to another embodiment of the present disclosure, there is provided a method of manufacturing a touch substrate including a touch region and a black matrix pattern surrounding the touch region. The manufacturing method includes: forming a plurality of touch electrode patterns on the touch region, wherein the touch electrode pattern includes a first portion overlapped on the black matrix pattern, in the first portion, if an included angle formed by a first edge and an extending line of a second edge is less than 120°, the first edge and the second edge are formed to be connected with at least one third edge, and the third edge at least partially has a smooth shape.

The features not described in detail in the present embodiment may be referred to the foregoing embodiments, and therefore, the description will not be repeated herein.

According to the present embodiment, by forming the first portion of the touch electrode pattern in a smooth shape, the electric field intensity at the tip of the first portion will be significantly reduced, thereby reducing the risk of electric breakthrough of the black matrix pattern, which improves the ESD resistance of the edge region of the touch substrate, enhances the ESD resistance of the overall product, and improves the production yield of the touch substrate.

The foregoing is a preferred implementation of the present disclosure and it should be noted that, it will be apparent to those skilled in the art that a number of improvements and modifications may be made without departing from the principle of the present disclosure, and these improvements and modifications should be regarded as the protection scope of the present disclosure.

What is claimed is:

1. A touch substrate, comprising a touch region and a black matrix pattern surrounding the touch region, the touch substrate comprising a plurality of touch electrode patterns, wherein the touch electrode pattern comprises a first portion overlapped on the black matrix pattern, and wherein in the first portion, if an included angle formed by a first edge and an extending line of a second edge is less than 120°, the first edge and the second edge are formed to be connected with at least one third edge, such that included angles between two edges adjacent to each other among the first edge, the second edge and the third edge are greater than 120°.

2. The touch substrate according to claim 1, wherein the first portion comprises a first line segment, a second line segment, . . . , and an $n^{th}$ line segment which are sequentially connected end to end, wherein an included angle between a $k^{th}$ line segment and a $(k+1)^{th}$ line segment is greater than a preset threshold value, k is an integer not less than 1 and not greater than n−1, and n is a positive integer greater than 2.

3. The touch substrate according to claim 2, wherein n is a positive integer less than 10.

4. The touch substrate according to claim 2, wherein each of lengths of the second line segment, . . . , and the $(n-1)^{th}$ line segment is equal to each other.

5. The touch substrate according to claim 2, wherein each of lengths of the second line segment, . . . , and the $(n-1)^{th}$ line segment is greater than 1.5d, wherein d is an interval between adjacent touch electrode patterns.

6. The touch substrate according to claim 2, wherein each of lengths of the second line segment, . . . , and the $(n-1)^{th}$ line segment is equal to 2d, wherein d is an interval between adjacent touch electrode patterns.

7. The touch substrate according to claim 1, wherein an included angle between any adjacent two edges of the first portion is less than 170°.

8. The touch substrate according to claim 7, wherein the included angle between any adjacent two edges of the first portion is 150°.

9. A touch screen, comprising:
a display panel; and
the touch substrate according to claim 1.

10. The touch screen according to claim 9, wherein the first portion comprises a first line segment, a second line segment, . . . , and an nth line segment which are sequentially connected end to end, wherein an included angle between a kth line segment and a (k+1) th line segment is greater than a preset threshold value, k is an integer not less than 1 and not greater than n−1, and n is a positive integer greater than 2.

11. The touch screen according to claim 10, wherein n is a positive integer less than 10.

12. The touch screen according to claim 10, wherein each of lengths of the second line segment, . . . , and the (n−1)th line segment is equal to each other.

13. The touch screen according to claim 10, wherein each of lengths of the second line segment, . . . , and the (n−1)th line segment is greater than 1.5d, wherein d is an interval between adjacent touch electrode patterns.

14. The touch screen according to claim 10, wherein each of lengths of the second line segment, . . . , and the (n−1)th line segment is equal to 2d, wherein d is an interval between adjacent touch electrode patterns.

15. The touch screen according to claim 9, wherein an included angle between any adjacent two edges of the first portion is less than 170°.

16. The touch screen according to claim 15, wherein the included angle between any adjacent two edges of the first portion is 150°.

17. A touch substrate, comprising a touch region and a black matrix pattern surrounding the touch region, the touch substrate comprising a plurality of touch electrode patterns, wherein the touch electrode pattern comprises a first portion overlapped on the black matrix pattern, and wherein in the first portion, if an included angle formed by a first edge and an extending line of a second edge is less than 120°, the first edge and the second edge are formed to be connected with at least one third edge, and the third edge at least partially has a smooth shape.

18. The touch substrate according to claim 17, wherein the smooth shape comprises a circular-arc curve.

19. The touch substrate according to claim 17, wherein a radius of curvature of the arc-shaped curve is greater than a predetermined threshold value.

20. A touch screen, comprising:
a display panel; and
the touch substrate according to claim 17.

* * * * *